United States Patent
Ashton

[11] Patent Number: 6,144,040
[45] Date of Patent: Nov. 7, 2000

[54] VAN DER PAUW STRUCTURE TO MEASURE THE RESISTIVITY OF A DOPED AREA UNDER DIFFUSION AREAS AND GATE STRUCTURES

[75] Inventor: Robert A. Ashton, Orlando, Fla.

[73] Assignee: Lucent Technologies Inc., Murray Hill, N.J.

[21] Appl. No.: 09/235,984

[22] Filed: Jan. 22, 1999

[51] Int. Cl.[7] .................................................. H01L 23/58
[52] U.S. Cl. .......................... 257/48; 257/536; 324/765; 324/769; 438/17; 438/18
[58] Field of Search ..................... 257/48, 536; 324/765, 324/769; 438/17, 18

[56] References Cited

U.S. PATENT DOCUMENTS 3,487,301  12/1969  Gardner et al. ............................ 324/64
4,906,921   3/1990  Juge ..................................... 324/158 R

FOREIGN PATENT DOCUMENTS

363009944  1/1988  Japan .
10303211   11/1998  Japan .

*Primary Examiner*—William Mintel

[57] ABSTRACT

The present invention provides a van der Pauw semiconductor test structure for and a method of testing a resistivity of a doped area formed within a substrate of a semiconductor wafer which may be under a diffusion area or a gate structure. The test structure can include field oxide regions formed on a surface of the substrate and a base doped substrate formed within the substrate. Further, the test structure includes a first primary tub and secondary tubs that are formed within the base doped substrate, each of the secondary tubs having a first diffusion region formed adjacent to an inner isolation structure and a second diffusion region formed adjacent to an outer isolation structure. A second primary tub is located adjacent the first primary tub and a dielectric layer is formed over the substrate having contacts formed within the dielectric layer and between the isolation structures. Further still, the test structure may include a gate structure as part of the semiconductor test structure, with the gate structure having openings formed therein through which the contacts extend to the first diffusion regions and the second diffusion regions.

16 Claims, 8 Drawing Sheets

VAN DER PAUW STRUCTURE TO MEASURE THE RESISTIVITY OF A DOPED AREA UNDER DIFFUSION AREAS AND GATE STRUCTURES

TECHNICAL FIELD OF THE INVENTION

The present invention is directed, in general, to a semiconductor test structure and, more specifically, to a van der Pauw test structure for measuring a resistivity of a doped area affected by other diffusion areas and gate structures.

BACKGROUND OF THE INVENTION

The measurement of resistivity or sheet resistance in semiconductor doped regions, such as tubs (or wells), which are built on semiconductor substrates is a standard parameter characterized in CMOS technologies. Typically, a tub sheet resistance is measured under field oxide. This parameter is generally the measurement of interest when the area is being used as a resistor in an analog circuit or as an input resistor in an electrostatic discharge (ESD) protection circuit. The sheet resistance of the tub under field oxide is not the only value of interest, however. Tub resistance will typically be different under opposite-polarity diffusion areas or gate regions as compared to measurements under only field oxide. The values of tub resistance under opposite-polarity diffusion areas or gate regions are important in the determination of parasitic properties such as the effectiveness of tub contacts in latch up protection. However, the tub resistance under opposite-polarity diffusion areas or gate regions is typically not measured due to the lack of suitable test structures.

The origin of different tub sheet resistances under these field oxides, diffusion areas and gate structures may be attributed to the major differences in the doping profiles at the top surface of the tub for these conditions. Under field oxide, the tub doping may also be affected by any additional channel-stopping implants that are used under the field oxide. The tub sheet resistance will also be affected by the depletion width of the junction, which depends on the voltage difference between the tub and the substrate.

Under opposite-polarity diffusion areas (e.g., a p+ diffusion area for an N-tub), threshold voltage adjustment implants and the top of the tub doping will be counter doped by the opposite polarity diffusion thereby increasing the resistance of the tub. Depletion effects derived from both the opposite-polarity diffusion area to the tub and the tub to substrate junctions will affect the tub sheet resistance under the opposite-polarity diffusion area. Under a gate region (e.g., a p-channel gate region for an N-tub), channel-stop implants will not typically be included in the tub doping profile. However, threshold voltage adjustment implants will affect the tub doping profile. The tub sheet resistance will also be affected by the substrate voltage and by the gate voltage as the surface under the gate oxide is moved from accumulation, to depletion and into inversion.

The van der Pauw measurement technique has been used to accurately measure the sheet resistance of an arbitrarily shaped conductor provided that several measurement criteria are met. The measurement contacts to the sample to be measured must be on the outer edges of the sample, and the contact size must be small compared to the sample area. The sample must be of generally uniform thickness and must be singly connected containing no isolated holes.

Two voltage-current measurements are then made using the same four contact points on the periphery of the sample. First, a current is forced between two adjacent contacts, while the resulting voltage is measured between the two remaining contacts. The measurement is then repeated after shifting all current and voltage contacts clockwise or counter clockwise by one contact. The resulting two calculated resistances are then averaged to provided an average measured resistance value. The sheet resistance of the sample may then be calculated to be 4.532 times the average measured resistance value. This technique has been successfully applied to the measurement of tub sheet resistance for tubs formed under field oxide.

In summary, the resistivity or sheet resistance of a tub or well may be modified considerably due to many different sources. Some of these include channel-stopping implants, the depletion width of a junction, threshold voltage adjustment implants and applied substrate and gate voltages. Unfortunately, the current van der Pauw test devices can only measure the tub sheet resistance under field oxide.

Accordingly, what is needed in the art is a way to accurately determine the resistivity of a doped area of a semiconductor wafer under a diffusion of opposite type or under a MOS transistor gate.

SUMMARY OF THE INVENTION

To address the above-discussed deficiencies of the prior art, the present invention provides a van der Pauw semiconductor test structure for and a method of testing a resistivity of a doped area formed within a semiconductor wafer. In one embodiment, the test structure includes a first primary tub doped with a first-type dopant and formed within a substrate of the semiconductor wafer that is doped with a second-type dopant having a polarity opposite to that of the first-type dopant.

Further, the van der Pauw semiconductor test structure includes at least four secondary tubs, where each is doped with the first-type dopant, that partially overlap the first primary tub to connect each of the secondary tubs to the first primary tub. Each of the secondary tubs also includes an inner isolation structure and a first diffusion region doped with the first-type dopant wherein the first diffusion region is doped with a higher concentration of the first-type dopant than the first primary tub. Additionally, each of the secondary tubs includes a second diffusion region, which is doped with the second-type dopant such that the inner isolation structure electrically isolates the first diffusion region from the second diffusion region. Each of the first diffusion regions is connected to a first contact and each of the second diffusion regions is connected to a second contact, respectively.

The van der Pauw semiconductor test structure also includes a second primary tub that is doped with the second-type dopant and that is located adjacent to the first primary tub. The van der Pauw semiconductor test structure also includes an outer isolation structure covering a substantial portion of the substrate. The outer isolation structure partially extends inside the primary tub and each of the secondary tubs, with the outer isolation structure isolating the second diffusion region from the second primary tub. The van der Pauw semiconductor test structure further includes contacts connected to the second primary tub.

Thus, one aspect of the present invention provides a test structure and method that may be used to determine the impact of additional diffusion areas and structures on the resistivity of a semiconductor doped area. The semiconductor doped area under test may be used to construct resistive components. The corresponding sheet resistance, derived from the resistivity measurement, is also an important consideration in successful determination of the latch-up characteristics pertinent to CMOS technologies. Additionally, variations of the resistivity with respect to substrate and other diffusion area test voltages allow the confirmation of doping profiles for the semiconductor doped area under test.

In one embodiment, the inner and outer isolation structures of the van der Pauw semiconductor test structure comprise field oxide. Additionally, the field oxide has openings formed therein through which each of the first and second contacts extend to connect to the first and second diffusion regions, respectively. The first and second contacts are metal contacts. The van der Pauw test structure further includes a dielectric layer formed over each of the inner and outer isolation structures that has openings formed therein through which each of the first and second contacts extend to connect to each of the first and second diffusion regions, respectively.

In another embodiment, the inner isolation structure of the van der Pauw semiconductor test structure comprises a gate structure that covers all of the first primary tub, most of the secondary tubs and extends over the edge of the outer isolation structure, which comprises field oxide. The inner isolation structure comprising the gate structure has openings formed therein through which each of the first and second contacts extend to connect to the first and second diffusion regions, respectively. This embodiment of the van der Pauw semiconductor test structure typically includes a dielectric layer formed over each of the inner and outer isolation structures that has openings formed therein through which each of the first and second contacts extend. The gate structure also includes a contact for electrical connection.

In an embodiment to be described and illustrated, the van der Pauw semiconductor test structure is constructed where the first primary tub is doped as an N-tub, the substrate is a P-type substrate, the second primary tub is a P-tub, the first-type dopant in an n-type dopant, and the second-type dopant is a p-type dopant.

In an alternate embodiment, the van der Pauw semiconductor test structure includes the first primary tub that is a P-tub, the second primary tub is an N-tub, the substrate is an N-type substrate, the first-type dopant is a p-type dopant, and the second-type dopant is an n-type dopant.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
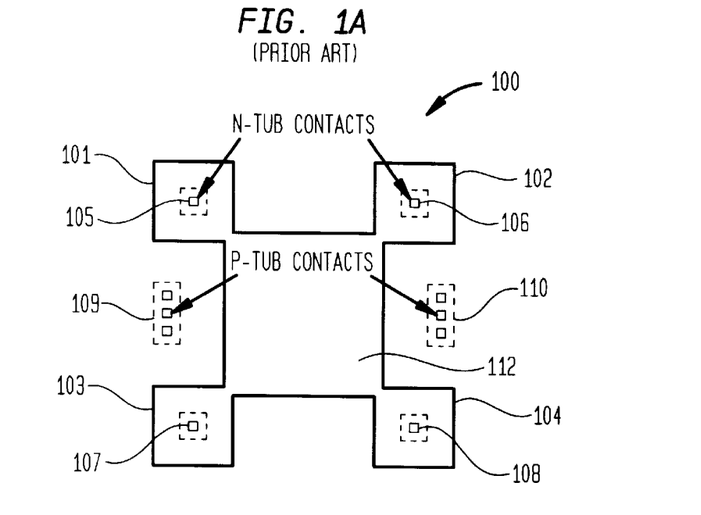
FIG. 1A illustrates a top view of a prior art van der Pauw test structure that may be used to determine the resistivity of an N-tub measured under a field oxide.

Referring initially to FIG. 1A, illustrated is a top view of a prior art van der Pauw test structure 100 that may be used to determine the resistivity of an N-tub measured under a field oxide. The van der Pauw test structure 100 includes first, second, third and fourth sub-test structures 101, 102, 103, 104, which are located at the four corners of an N-tub 112 that is to be tested. Each of the first, second, third and fourth sub-test structures 101, 102, 103, 104 contain a first, second, third and fourth N-tub electrical contact 105, 106, 107 108 respectively, which may be used for connecting with the N-tub 112 for test purposes. Further, a first and second set of P-tub electrical contacts 109, 110 are shown that allow connection to a P-tub 116 (illustrated more clearly in FIG. 1C), which surrounds the N-tub 112. The first and second set of P-tub electrical contacts 109, 110 may also be used for testing of the N-tub 112 by varying the N-tub to substrate voltage.

Figure 1B:
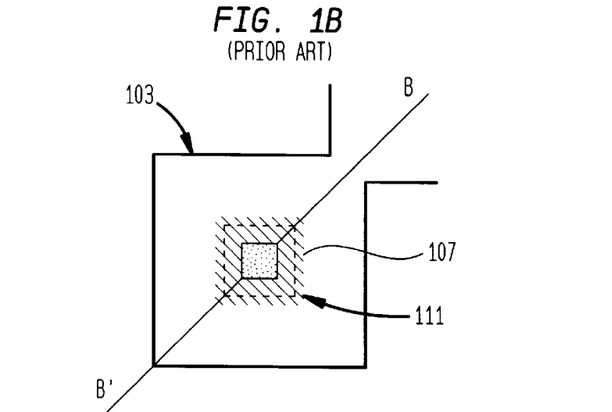
FIG. 1B illustrates a enlargement of the third sub-test structure showing enhanced detail for the prior art van der Pauw test structure of FIG. 1A.

Turning now to FIG. 1B, illustrated is an enlargement of the third sub-test structure 103 showing enhanced detail for the prior art van der Pauw test structure 100 of FIG. 1A. The third sub-test structure 103 is typical of the other first, second and fourth sub-test structures 101, 102, 104. The third sub-test structure 103 includes the third N-tub electrical contact 107, which in turn is connected to an n+diffusion area 111 that creates improved connectivity to the N-tub 112. A section line BB, which traverses the area diagonally, is also shown to indicate the plane of view for FIG. 1C.

Figure 1C:
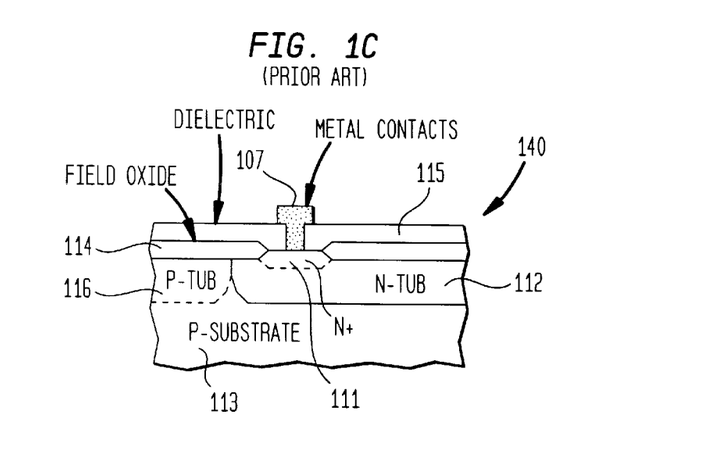
FIG. 1C illustrates a sectional view, which is viewed along the section BB as referenced in FIG. 1B, showing additional details of the third sub-test structure.

Turning now to FIG. 1C, illustrated is a sectional view 140, which is viewed along the section BB as referenced in FIG. 1B, showing additional details of the third sub-test structure 103. The sectional view 140 shows the arrangement of the test structure elements of the third sub-test structure 103 including the corner edge of the N-tub 112, which contains the n+diffusion area 111, whereas the N-tub 112 is formed within a p-substrate 113. Further included are a field oxide layer 114, a dielectric layer 115, the N-tub electrical contact 107 and the P-tub 116. Bias voltages may be applied to the first and second set of P-tub electrical contacts 109, 110, and the van der Pauw test method is applied using the first, second, third and fourth N-tub electrical contacts 105, 106, 107 and 108.

Although accurate measurements of resistivity may be obtained under field oxides, current situations demand that accurate resistivity values be obtained under diffusions and under gate.

Figure 2A:
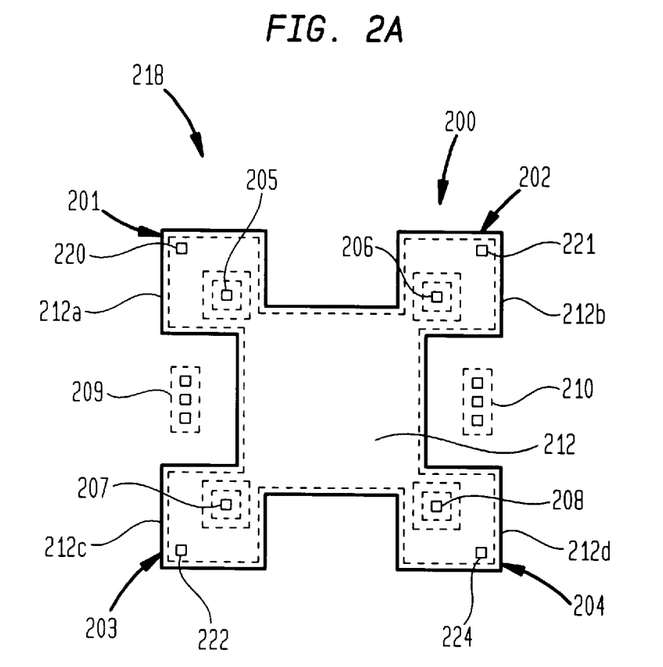
FIG. 2A illustrates a top view of an embodiment of a van der Pauw test structure that may be used to determine the resistivity of a first-tub measured under a second-type diffusion area.

Turning now to FIG. 2A, illustrated is a top view of an embodiment of a van der Pauw semiconductor test structure 200 as provided by the present invention that may be used to determine the resistivity of a doped area of a semiconductor wafer. The van der Pauw semiconductor test structure 200 includes a first primary tub 212 that is doped with a first type dopant and is formed within a substrate of the semiconductor wafer that is doped with a second-type dopant having a polarity opposite that of the first-type dopant. The current embodiment of the present invention includes first, second, third and fourth sub-test structures 201, 202, 203, 204, as shown, located at the four corners of the doped area that is to be tested consisting of the first primary tub 212.

Each of the first, second, third and fourth sub-test structures 201, 202, 203, 204 includes a first, second, third and fourth secondary tub 212a, 212b, 212c and 212d, respectively which is doped with the first-type dopant and partially overlaps the first primary tub 212 to connect each of the secondary tubs 212a, 212b, 212c, and 212d to the first primary tub 212. Basically, the first primary tub 212 extends to the perimeter of each of these sub-test structures to form the secondary tubs in each of the sub-test structures.

Each sub-test structure further includes a first diffusion region 211 (illustrated more clearly in FIG. 2B) doped with the first-type dopant and a first set of electrical contacts, which includes first, second, third and fourth first contacts 205, 206, 207 and 208, respectively, which may be used for connecting with the first diffusion region 211 in their respective sub-test structures. The first diffusion regions are used for connecting with the secondary tubs 212a, 212b, 212c and 212d, respectively, for test purposes.

Further, each of the first, second, third and fourth sub-test structures 201, 202, 203, 204 also includes second diffusion regions 230 doped with the second-type dopant, and a second set of electrical contacts comprising first, second, third and fourth second contacts 220, 221, 222 and 224, respectively. An inner isolation structure 225 electrically isolates the first diffusion region 211 from the second diffusion region 230.

Further still, a first and second set of electrical contacts 209, 210 are shown that allow connection to a second primary tub 216 (illustrated more clearly in FIG. 2C), which is adjacent to the first primary tub 212 to be tested. The electrical contacts 209, 210 may also be used to support tests on the first primary tub 212. The second primary tub 216 is doped with the second-type dopant. An outer isolation structure 214 covers a substantial portion of the substrate and partially extends inside the first primary tub and each of the secondary tubs to isolate the second diffusion region 230 from the second primary tub 216.

Figure 2B:
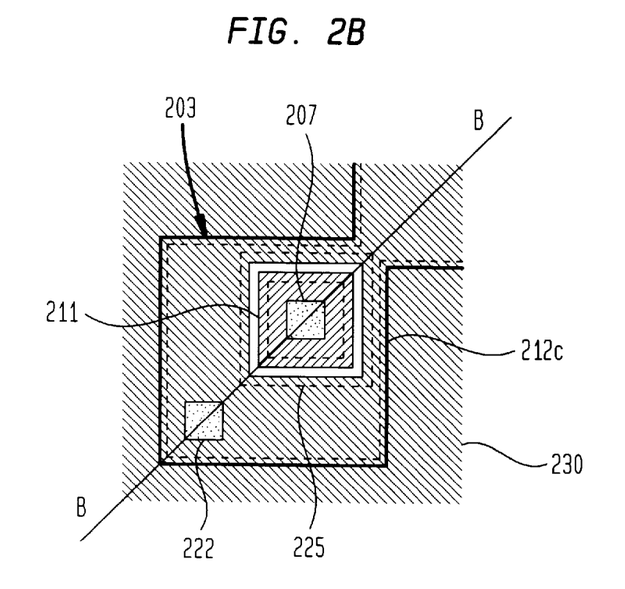
FIG. 2B illustrates an enlargement of the third sub-test structure showing enhanced detail for the van der Pauw test structure of FIG. 2A.

Turning now to FIG. 2B, illustrated is an enlargement of the third sub-test structure 203 showing enhanced detail for the van der Pauw semiconductor test structure 200 of FIG. 2A. The third sub-test structure 203 is typical of the other first, second and fourth sub-test structures 201, 202, 204. The third sub-test structure 203 includes the first contact 207, which in turn is connected to the first diffusion region 211 to create improved connectivity to the third secondary tub 212c. A ring of field oxide forms the inner isolating structure 225 that isolates the first diffusion region 211 and the first contact 207 from the second diffusion region 230 and the second contact 222. Alternately, a ring of gate may replace the field oxide ring. A section line BB, which traverses the area diagonally, is also shown to indicate the plane of view for FIG. 2C.

Figure 2C:
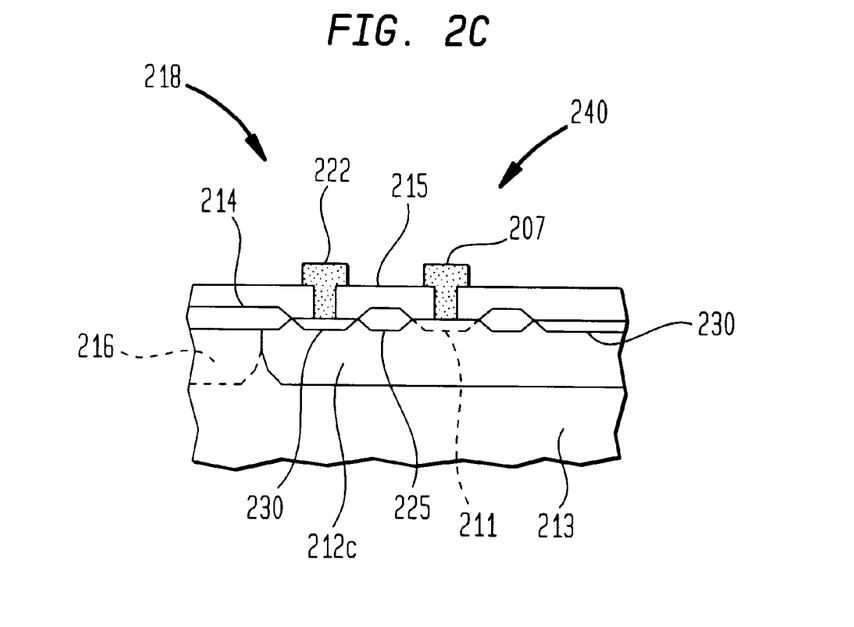
FIG. 2C illustrates a sectional view, which is viewed along the section BB as referenced in FIG. 2B, showing additional details of the third sub-test structure 203.

Turning now to FIG. 2C, illustrated is a sectional view 240, which is viewed along the section BB as referenced in FIG. 2B, showing additional details of the third sub-test structure 203. The sectional view 240 shows the arrangement of the test structure elements of the third sub-test structure 203 including the corner edge of the third secondary tub 212c, the first diffusion region 211, the second diffusion region 230, and the substrate 213, which has a polarity that is opposite to that of the third secondary tub 212c. For example, if the third secondary tub 212c is doped with an n-type dopant, the substrate 213 will be doped with a p-type dopant. Further included are field oxide layers 214, a dielectric layer 215, the first contact 207, the second contact 222 and the second primary tub 216. The field oxide layers 214 are formed by conventional processes and are positioned to electrically isolate the second diffusion regions 230 from the second primary tub 216 and the substrate 213.

This embodiment introduces the broad concept of providing the van der Pauw semiconductor test structure 200 for measuring a resistivity of the first primary tub 212 under second diffusion regions 230 having opposite polarity to the doped region of the first primary tub 212, which is to be tested. The test structure of this embodiment includes the field oxide regions which form the outer isolation structure 214 and the inner isolation structure 225, which were formed on a top surface of a semiconductor wafer 218 to electrically isolate the second diffusion region 230 from other similarly doped areas within the wafer. An important aspect of the present invention is that it provides a test structure and method that may be used to determine the impact of additional diffusion areas and structures on the resistivity of a semiconductor doped area. As stated earlier, knowing the exact resistivity is necessary to accurately designing resistive components and predicting parasitic responses.

Figure 2D:
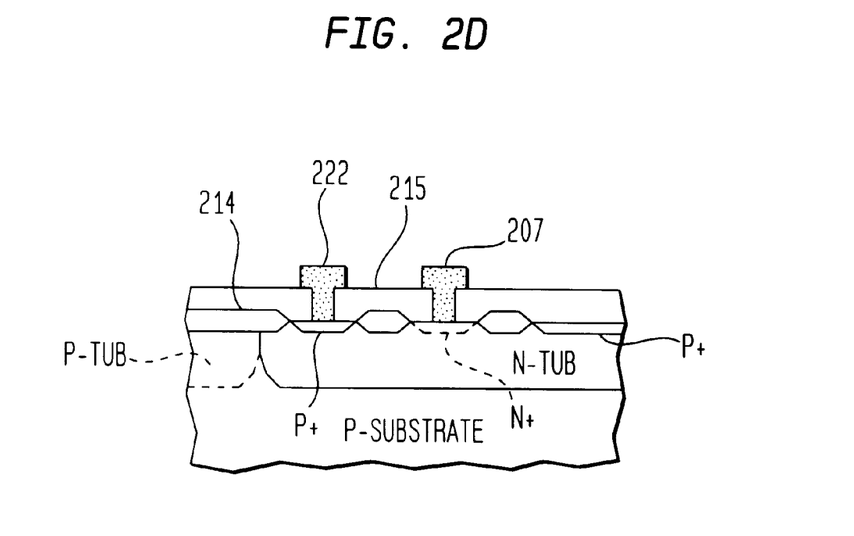
FIG. 2D illustrates a specific doping scheme which may be used in one embodiment of the present invention.

Turning now to FIG. 2D, there is a specific doping scheme which may be used in one embodiment of the present invention. In this particular embodiment, the third secondary tub 212c of sub-test structure 203 is an N-tub and the second diffusion regions 230 are p-type diffusion areas. This same dopant scheme, of course is repeated in sub-test structures 201, 202 and 204. In such instances, the first diffusion regions 211 are then n-type diffusion areas and the substrate 213 is a p-type doped region having a dopant concentration less than that of each of the p-type diffusion areas. The second contact 222 is connected to the p-type diffusion area 230 and the first contact 207 is connected to the n-type diffusion 211. The second primary tub 216, in this particular embodiment is a P-tub. In another embodiments, the polarities or doping scheme as presented here, of course, may be reversed.

Figure 2E:
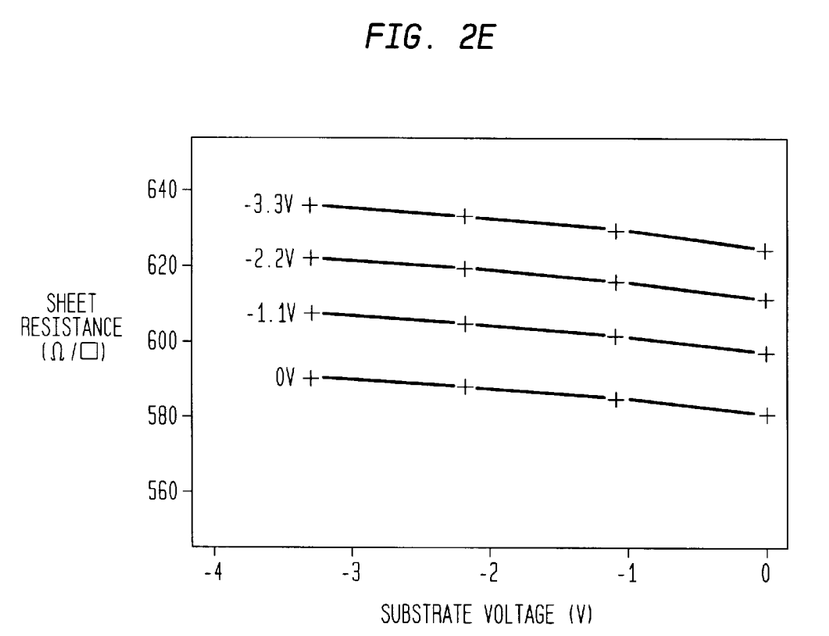
FIG. 2E illustrates a set of curves showing resistivity measurements for the van der Pauw semiconductor test structure of FIG. 2A having the polarities of FIG. 2D.

Turning now to FIG. 2E, illustrated is a set of curves showing resistivity measurements for the van der Pauw semiconductor test structure of FIG. 2A having the polarities of FIG. 2D. The set of curves of FIG. 2E show the resistivity or sheet resistance versus the substrate voltage for a first primary tub that is an N-tub under a p-type second diffusion region. N-tub resistivity is measured for four values of voltages applied to the p-type second diffusion regions that vary from zero to −3.3 volts. The resistivity is seen to vary from about 580 ohms/square to about 635 ohms/square.

Figure 3A:
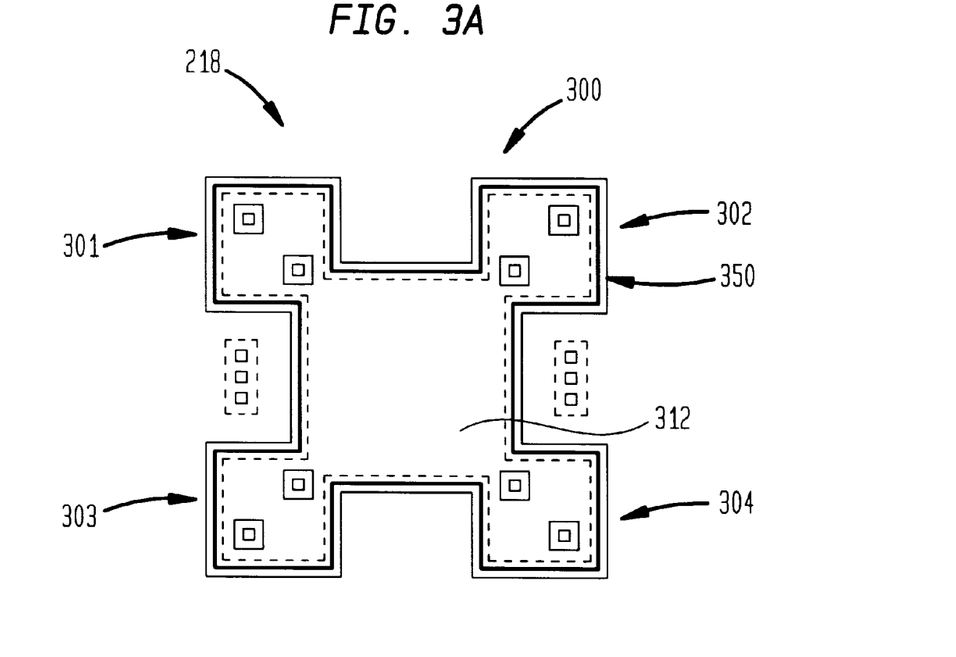
FIG. 3A illustrates a top view of an alternate embodiment of a van der Pauw test structure that may be used to determine the resistivity of a first-tub measured under a gate structure.

Turning now to FIG. 3A, illustrated is a top view of an alternate embodiment of a van der Pauw semiconductor test structure 300 that may be used to determine the resistivity of a doped region measured under a gate structure 350 formed on a semiconductor wafer 218. The van der Pauw semiconductor test structure 300 includes sub-test structures 301, 302, 303 and 304, which are similar to those illustrated in FIG. 2A and discussed above with the exceptions that the gate structure 350 has been added and much of the second diffusion region 230 has been replaced with the gate structure 350. Additionally, the field oxide rings, which formed the inner isolation structure 225, have been removed. The gate structure 350 replaces the inner isolation structure 225 discussed in FIG. 2B.

Figure 3B:
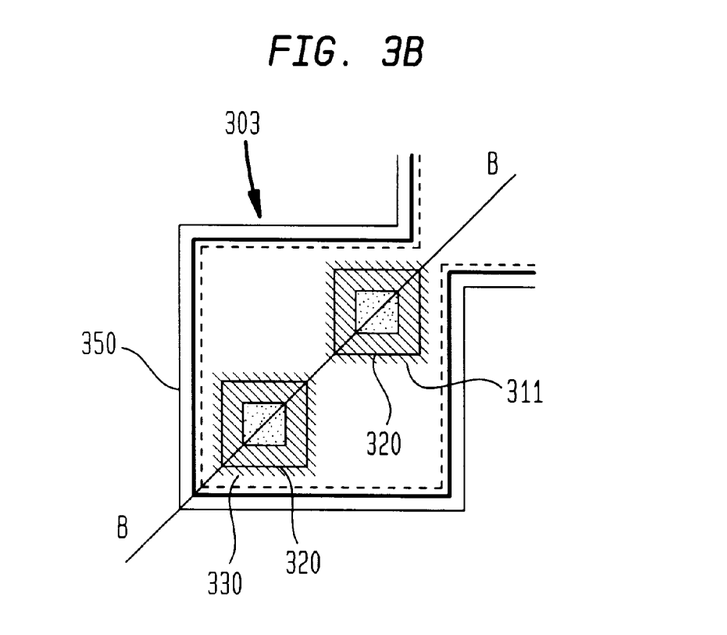
FIG. 3B illustrates an enlargement of one of the sub-test areas, which corresponds closely with FIG. 2B.

Turning now to FIG. 3B, illustrated is an enlargement of sub-test structure 303. Openings have been formed through the gate structure 350 and a second diffusion region 330 and a first diffusion region 311 have been formed.

Figure 3C:
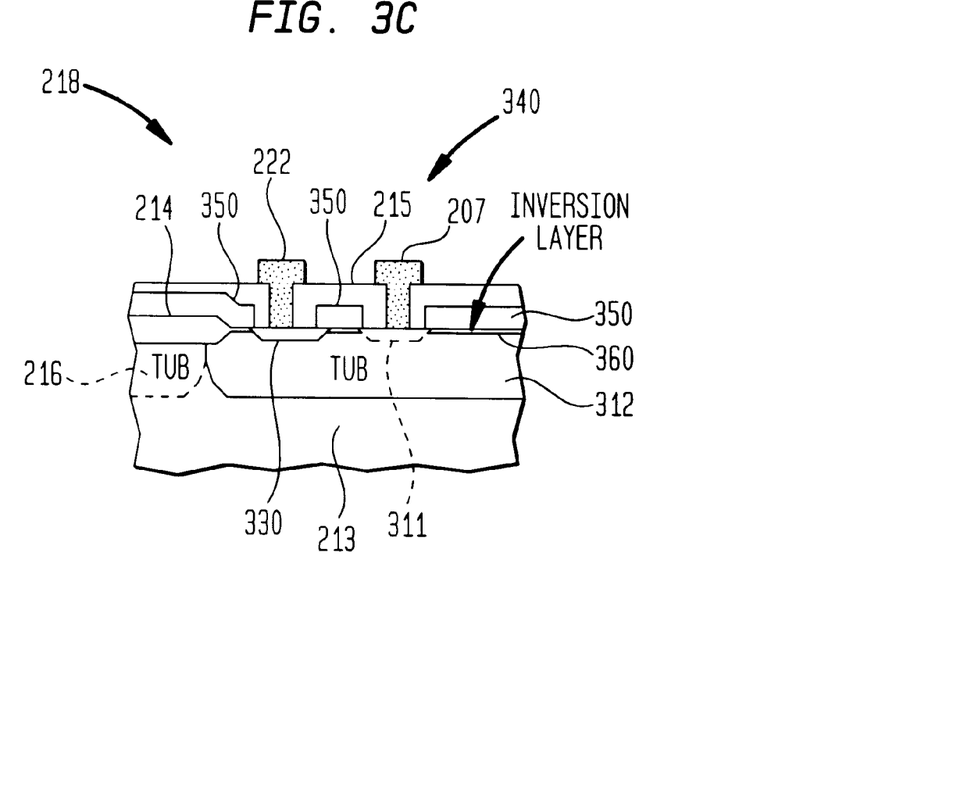
FIG. 3C illustrates a sectional view, viewed along the section BB of FIG. 3B, showing additional details of the alternate embodiment of the test structure.

Turning now to FIG. 3C, illustrated is a sectional view 340, viewed along the section BB of FIG. 3B, showing additional details of the alternate embodiment of the sub-test structure 303. The sectional view 340 shows the gate structure 350, which forms part of the van der Pauw semiconductor test structure 300 illustrated in FIG. 3A. The gate structure 350 has its own contact (not shown) as well as openings 320, as seen more clearly in FIG. 3B, formed in the gate structure 350 through which the first and second contacts 207 and 222 extend to the first diffusion region 311 and the second diffusion region 330, respectively. The presence of the gate structure 350 provides another degree of freedom that allows for extensive testing of the impact of such structures on the resistivity of the doped region 312. One of the ways that the gate structure 350 modifies the resistivity is by the creation of an inversion layer 360.

Figure 3D:
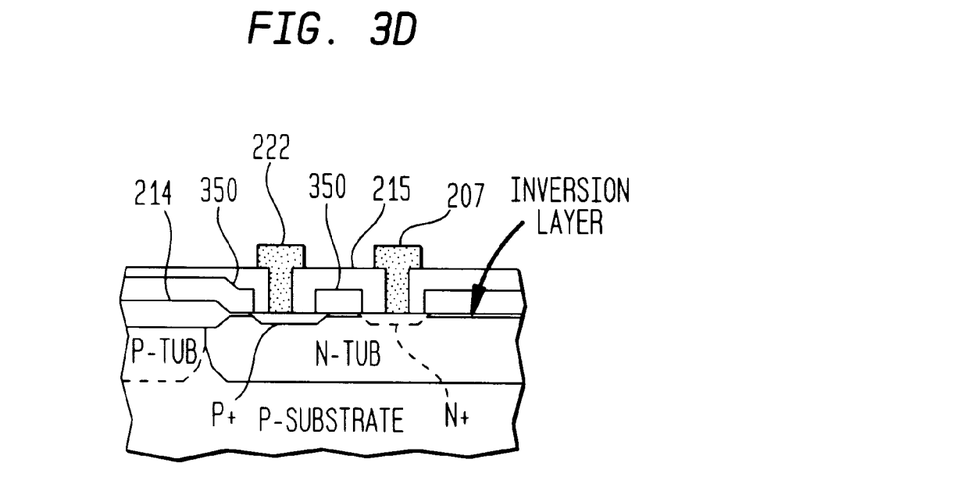
FIG. 3D illustrates a specific doping scheme that may be used in the embodiment illustrated in FIG. 3C of the present invention.

Turning now to FIG. 3D, there is illustrated a specific doping scheme that may be used in the embodiment illustrated in FIG. 3C of the present invention. With continued reference to FIGS. 3A, 3B and 3C the third sub-test structure 303 in the van der Pauw semiconductor test structure 300 is an N-tub, and the second diffusion region 330 is a p-type diffusion area, which along with the gate structure 350 forms a p-channel. The first diffusion region 311 is then an n-type diffusion area, and the substrate 213 is a p-type doped region having a dopant concentration less than that of each of the p-type diffusion areas. This same dopant scheme, of course is repeated in sub-test structures 301, 302 and 304, and it should be understood that the dopant scheme as presented in this specific embodiment may be reversed in a fashion similar to that discussed above for the embodiment illustrated in FIGS. 2A through 2D.

Figure 3E:
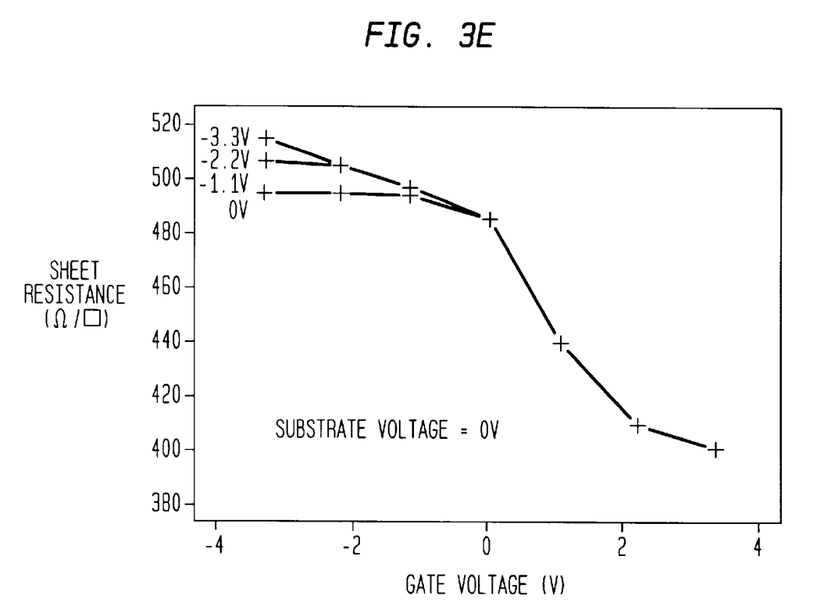
FIG. 3E, illustrates a set of curves showing resistivity measurements for the van der Pauw semiconductor test structure of FIG. 3A having the polarities of FIG. 3D.

Turning now to FIG. 3E, illustrated is a set of curves showing resistivity measurements for the van der Pauw semiconductor test structure of FIG. 3A having the polarities of FIG. 3D. The set of curves of FIG. 3E show the resistivity or sheet resistance versus the gate voltage at a substrate voltage of zero volts for a first primary tub that is an N-tub under a p-channel gate structure. N-tub resistivity is measured for four values of voltages applied to the p-type contacts affecting the inversion layer that vary from zero to −3.3 volts. The resistivity of the N-tub is seen to vary from about 400 ohms/square to about 515 ohms/square.

Figure 3F:
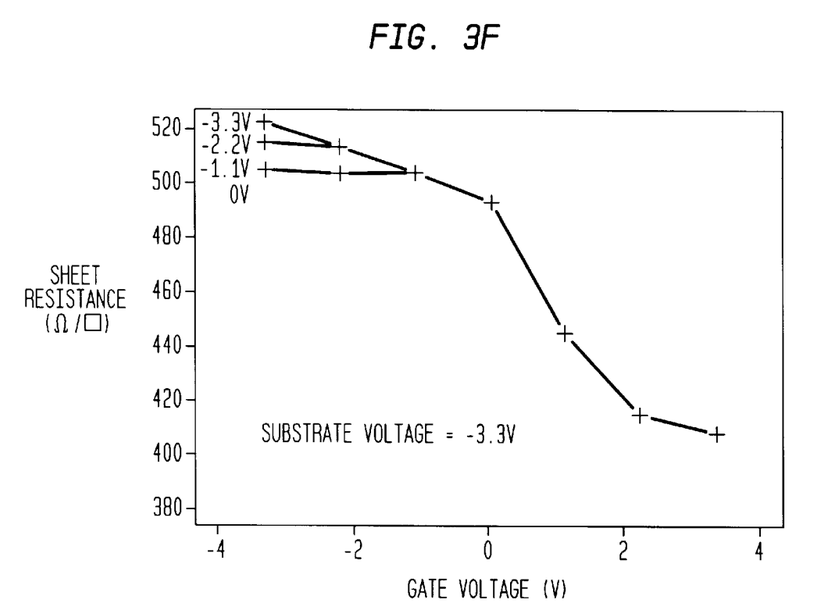
FIG. 3F, illustrates another set of curves showing resistivity measurements for the van der Pauw semiconductor test structure of FIG. 3A having the polarities of FIG. 3D.

Turning now to FIG. 3F, illustrated is another set of curves showing resistivity measurements for the van der Pauw semiconductor test structure of FIG. 3A having the polarities of FIG. 3D. The set of curves of FIG. 3E show the resistivity or sheet resistance versus the gate voltage at a substrate voltage of −3.3 volts for a first primary tub that is an N-tub under a p-channel gate structure. N-tub resistivity is again measured for four values of voltages applied to the p-type contacts affecting the inversion layer that vary from zero to −3.3 volts. The resistivity is seen to vary from about 400 ohms/square to about 525 ohms/square.

Figure 4:
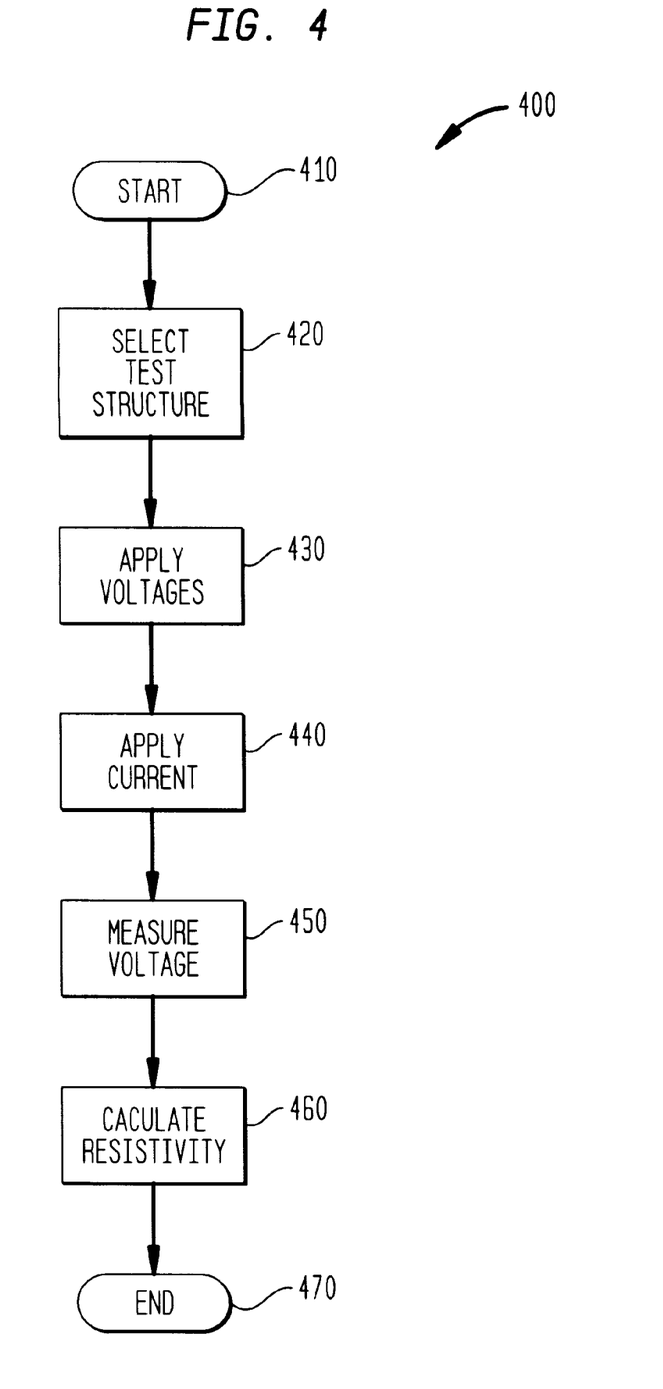
FIG. 4 illustrates a flow diagram showing a method of testing and measuring a resistivity according to the principles of the present invention.

Turning now to FIG. 4, illustrated is a flow diagram 400 showing a method of testing and measuring a resistivity of a doped area formed in a substrate of a semiconductor wafer using a van der Pauw semiconductor test structure according to the principles of the present invention. The method starts in a step 410 with a decision to select a test structure in a Step 420. The van der Pauw semiconductor test structure includes a first primary tub doped with a first-type dopant, along with a second primary tub that is doped with a second-type dopant and located adjacent to the first primary tub. The van der Pauw semiconductor test structure further includes first, second, third and fourth secondary tubs each doped with the first-type dopant and including an inner isolation structure. Additionally, each of the secondary tubs includes a first diffusion region that is doped with the first-type dopant and a second diffusion region that is doped with a second-type dopant. A first contact is connected to each of the first-type diffusion regions and a second contact is connected to each of the second-type diffusion regions.

The step 420 includes the decision as to whether to use a van der Pauw semiconductor test structure that includes a gate structure or one that includes only the second diffusion region doped with the second-type dopant. In this embodiment, a non-gate structure is selected. Selection of the test structure in the Step 420 has assured that the second diffusion regions are electrically isolated from a base doped substrate of the first, second third and fourth secondary tubs of the van der Pauw semiconductor test structure.

The method continues in a Step 430 by applying a first voltage to the substrate or to the electrical contacts connected to the second primary tub. Then, a second voltage is applied between the substrate and the second contacts connected to the second-type diffusion regions of the first, second, third and fourth secondary tubs.

The method continues with determining a first resistance of the doped area in a step 440 by applying or forcing a first current between the first contacts of the first and second secondary tubs. Next, a third voltage is measured between the first contacts of the third and fourth secondary tubs in a step 450. Then, a second resistance of the doped area is determined by reverting back to the step 440 and applying a second current of the same magnitude as the first current between the first contacts of the first and third secondary tubs. Finally, a fourth voltage is measured between the first contacts of the second and fourth secondary tubs in the step 450. Thus, a first and second set of currents and their corresponding voltages are determined.

Of course, the first resistance measurement may be conducted by using any adjacent pair of first contacts in adjacent secondary tubs for applying the first current. Then, the second resistance is determined by applying the second current to another adjacent pair of first contacts in adjacent secondary tubs that are located either one secondary tub clockwise or counter-clockwise from the secondary tubs used for applying the first current. In each case, the third and fourth voltage measurements would be conducted across the first contacts of the secondary tubs not used for applying the first and second currents. Additionally, care is taken that the applied voltages and currents do not forward bias any of the junctions in the semiconductor test structure.

The method continues in a Step 460 by determining a first resistance of the doped area by using the first set of voltage and current values, and then determining a second resistance of the doped area by using the second set of voltage and current values. These first and second resistor values are then averaged and multiplied by the van der Pauw constant to obtain the resistivity or sheet resistance of the doped area under test. The method ends in a Step 470.

Although the present invention has been described in detail, those skilled in the art should understand that they can make various changes, substitutions and alterations herein without departing from the spirit and scope of the invention in its broadest form.

What is claimed is:

1. A van der Pauw semiconductor test structure for testing a resistivity of a doped area formed within a semiconductor wafer, comprising:
   a first primary tub doped with a first-type dopant and formed within a substrate of the semiconductor wafer that is doped with a second-type dopant having a polarity opposite that of the first-type dopant;
   at least four secondary tubs each doped with the first-type dopant and partially overlapping the primary tub to connect each of the secondary tubs to the first primary tub, each of the secondary tubs including an inner isolation structure and a first diffusion region doped with the first-type dopant and a second diffusion region doped with the second-type dopant, the inner isolation structure electrically isolating the first diffusion region from the second diffusion region, each of the first diffusion regions having a first contact connected thereto and each of the second diffusion regions having a second contact connected thereto;
   a second primary tub doped with the second-type dopant and located adjacent the first primary tub; and
   an outer isolation structure covering a substantial portion of the substrate and partially extending inside the primary tub and each of the secondary tubs, the outer isolation structure isolating the second diffusion region from the second primary tub.

2. The van der Pauw semiconductor test structure as recited in claim 1 wherein the inner and outer isolation structures comprises field oxide.

3. The van der Pauw semiconductor test structure as recited in claim 2 wherein the field oxide has openings formed therein through which each of the first and second contacts extend to connect to the first and second contact regions, respectively.

4. The van der Pauw semiconductor test structure as recited in claim 1 wherein the inner isolation structure comprises a gate structure that covers all of the primary tub, a substantial portion of the secondary tubs and extends over the edge of the outer isolation structure which comprises field oxide.

5. The van der Pauw semiconductor test structure as recited in claim 4 wherein the gate structure has openings formed therein through which each of the first and second contacts extend to connect to the first and second diffusion regions, respectively.

6. The van der Pauw semiconductor test structure as recited in claim 1 wherein the first primary tub is doped in an N-tub, the substrate is a P-type substrate, the second primary tub is a P-tub, the first-type dopant in an n-type dopant, and the second-type dopant is a p-type dopant.

7. The van der Pauw semiconductor test structure as recited in claim 1 wherein the first primary tub is a P-tub, the second primary tub is an N-tub, the substrate is an N-type substrate, the first-type dopant is a p-type dopant, and the second-type dopant is an n-type dopant.

8. The van der Pauw semiconductor test structures as recited in claim 1 further comprising contacts connected to the second primary tub.

9. The van der Pauw semiconductor test structure as recited in claim 1 further comprising a dielectric layer formed over each of the inner and outer isolation structures and having openings formed therein through which each of the contacts extend to connect to each of the first and second diffusion regions, respectively.

10. The van der Pauw semiconductor test structure as recited in claim 1 wherein the contacts are metal contacts.

11. The van der Pauw semiconductor test structure as recited in claim 1 wherein the first diffusion region is doped with a higher concentration of the first-type dopant than the first primary tub.

12. The van der Pauw semiconductor test structure as recited in claim 1 wherein the inner isolation structure comprises a gate structure that covers a substantial portion of the primary tub, a substantial portion of the secondary tubs and extends over the edge of the outer isolation structure which comprises field oxide.

13. A method for testing a resistivity of a doped area formed in a substrate of a semiconductor wafer using a van der Pauw semiconductor test structure comprising a first primary tub doped with a first-type dopant, a second primary tub doped with a second-type dopant and located adjacent the first primary tub, first, second, third and fourth secondary tubs each doped with the first-type dopant and including an inner isolation structure and a first diffusion region doped with the first-type dopant and a second diffusion region doped with a second-type dopant, each of the first-type diffusion regions having a first contact connected thereto and each of the second-type diffusion regions having a second contact connected thereto, the method comprising;
   applying a first voltage to electrical contacts connected to the second primary tub;
   applying a second voltage to one or more of the second contacts of the first, second, third and fourth secondary tubs; then
   determining a first resistance of the doped area by:
      applying a first current between the first contacts of the first and second secondary tubs; and
      measuring a third voltage between the first contacts of the third and fourth secondary tubs; and then
   determining a second resistance of the doped area by
      applying a second current between the first contacts of the first and third secondary tubs; and
      measuring a fourth voltage between the first contacts of the second and fourth secondary tubs; and then
   determining a sheet resistance of the doped area from the first and second resistances.

14. The method as recited in claim 13 wherein applying a first voltage includes applying a first voltage to p-type diffusion areas formed in P-tubs on a p-type substrate, applying a second voltage includes applying a second voltage to a p-type diffusion in an N-tub, applying a first current includes applying a first current to n-type diffusion areas formed in N-tubs and measuring a third voltage includes measuring a third voltage of n-type diffusion areas formed in N-tubs, applying a second current includes applying a second current to n-type diffusion areas formed in N-tubs and measuring a fourth voltage includes measuring a fourth voltage of n-type diffusion areas in N-tubs, the substrate being a p-type doped region having a dopant concentration less than that of each of the p-type diffusion areas.

15. The method as recited in claim 13 wherein applying a first voltage includes applying a first voltage to n-type diffusion areas formed in N-tubs on an n-type substrate, applying a second voltage includes applying a second voltage to an n-type diffusion in a P-tub, applying a first current includes applying a first current to p-type diffusion areas formed in P-tubs and measuring a third voltage includes measuring a third voltage of p-type diffusion areas formed in P-tubs, applying a second current includes applying a second current to p-type diffusion areas formed in P-tubs and measuring a fourth voltage includes measuring a fourth voltage of p-type diffusion areas in P-tubs, the substrate being an n-type doped region having a dopant concentration less than that of each of the n-type diffusion areas.

16. The method as recited in claim 13 wherein the van der Pauw semiconductor test structure further includes a gate structure formed thereon and having openings formed therein through which each of the first and second contacts extend to connect to the first and second diffusion regions, the method further comprising applying a gate voltage to the gate structure after applying the second voltage and prior to determining a first resistance.

* * * * *